United States Patent
Zota et al.

(10) Patent No.: US 10,810,506 B1
(45) Date of Patent: Oct. 20, 2020

(54) QUBIT BIASING SCHEME USING NON-VOLATILE DEVICES

(71) Applicant: International Business Machines Corporation, Armonk, NY (US)

(72) Inventors: Cezar Bogdan Zota, Rueschlikon (CH); Lukas Czornomaz, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/806,078

(22) Filed: Mar. 2, 2020

(51) Int. Cl.
| | |
|---|---|
| *G06N 10/00* | (2019.01) |
| *H03K 19/195* | (2006.01) |
| *G11C 11/44* | (2006.01) |
| *H03K 3/38* | (2006.01) |
| *G11C 13/00* | (2006.01) |

(52) U.S. Cl.
CPC .............. *G06N 10/00* (2019.01); *G11C 11/44* (2013.01); *G11C 13/0002* (2013.01); *H03K 3/38* (2013.01); *H03K 19/195* (2013.01)

(58) Field of Classification Search
CPC .... G06N 10/00; G11C 13/0002; G11C 11/44; H03K 3/38; H03K 19/195
USPC ............................................................ 326/1
See application file for complete search history.

(56) References Cited

U.S. PATENT DOCUMENTS

| | | | | |
|---|---|---|---|---|
| 8,138,784 | B2* | 3/2012 | Przybysz | G06N 10/00 326/4 |
| 2004/0077503 | A1* | 4/2004 | Blais | B82Y 10/00 505/190 |
| 2005/0098773 | A1* | 5/2005 | Vion | G06N 10/00 257/9 |
| 2015/0254571 | A1* | 9/2015 | Miller | G11C 11/44 326/3 |

(Continued)

FOREIGN PATENT DOCUMENTS

WO      2018182571 A1      10/2018

OTHER PUBLICATIONS

Galy et al., "Cryogenic Temperature Characterization of a 28-nm FD-SOI Dedicated Structure for Advanced CMOS and Quantum Technologies Co-Integration", Journal of the Electron Devices Society, Date of publication May 31, 2018, 7 pages, Digital Object Identifier 10.1109/JEDS.2018.2828465.

(Continued)

*Primary Examiner* — Don P Le
(74) *Attorney, Agent, or Firm* — Scott S. Dobson

(57) ABSTRACT

A quantum processing apparatus comprises control electronics, a switching unit, a bias line, and N electronic circuits. Both the switching unit and the bias line are connected to the control electronics. The N circuits comprise N respective, non-volatilely tunable resistors and N respective frequency-tunable, solid-state qubits. The control electronics are configured to individually tune the resistors via the switching unit, in a configuration mode of the apparatus; and apply a (Continued)

voltage bias to the electronic circuits via the bias line, in an operation mode of the apparatus. The electronic circuits are configured to passively apply respective bias signals to the qubits, wherein such bias signals are impacted by the resistors, in response to the voltage bias applied via the bias line, to operate the qubits at respective frequencies determined according to the respective bias signals.

18 Claims, 4 Drawing Sheets

(56) References Cited

U.S. PATENT DOCUMENTS

| | | | |
|---|---|---|---|
| 2015/0263736 A1* | 9/2015 | Herr | G06N 10/00 |
| | | | 326/4 |
| 2017/0308804 A1* | 10/2017 | Wabnig | G06N 10/00 |
| 2018/0013052 A1* | 1/2018 | Oliver | H01L 25/0652 |
| 2018/0314968 A1 | 11/2018 | Biamonte et al. | |
| 2019/0007051 A1* | 1/2019 | Sete | H03K 19/195 |
| 2019/0042967 A1 | 2/2019 | Yoscovits et al. | |

OTHER PUBLICATIONS

Tang et al., "ECRAM as Scalable Synaptic Cell for High-Speed, Low-Power Neuromorphic Computing", 2018 IEEE International Electron Devices Meeting (IEDM), Dec. 2018, 4 pages.

* cited by examiner

QUBIT BIASING SCHEME USING NON-VOLATILE DEVICES

BACKGROUND

The present disclosure relates in general to the field of quantum processing apparatuses and methods of operation thereof. In particular, it is directed to quantum computers relying on a qubit biasing scheme using non-volatile devices, to reduce the wiring complexity and improve the scalability of such computers.

Recent advances in quantum computing are making such a technology ever more relevant to industrial applications. Quantum computing makes direct use of quantum-mechanical phenomena, such as superposition and entanglement to perform operations on entangled qubits, i.e., states stored in qubits. For example, superconducting circuits are relatively easy to manufacture with current technologies and are thus promising candidates to further scale quantum information technologies. Small quantum computers based on a couple of hundreds of superconducting qubits with limited to no error correction are able to simulate quantum systems intractable to conventional computers. Possible applications on quantum machines include the solving of complex optimization problems that are beyond the reach of classical algorithms.

For superconducting qubits, better performance is usually achieved with quantum processing apparatuses involving fixed-frequency qubits. I.e., in such apparatuses, qubits are operated as fixed-frequency qubits, whereby the frequency of each qubit must be unique. This property, however, cannot be achieved strictly through the sole physical design of the qubits. In particular, solid-state qubit architectures (transmon, spin-based, and topological qubits) require individual biasing (current or voltage) of qubits to tune their energy levels (and thus their frequencies) during the operation of the quantum processing apparatus. Currently, this is achieved using a brute force approach, whereby one bias cable is used for each qubit, i.e., down to the lowest cryostat stage (e.g., the 10-20 mK cryostat stage).

Note, control and readout signals can, to a certain extent, be multiplexed (either through frequency our through active switching). The qubit bias, however, cannot easily be multiplexed since continuous unique signals must be sent to each qubit (a thing that holds true for both transmon- and spin qubit-architectures). This means that a system with a large number of qubits (e.g., larger than 100) requires an identically large number of cables extending down to the lowest cryostat stage.

SUMMARY

According to a first aspect, the present invention is embodied as a quantum processing apparatus. The apparatus comprises control electronics, a switching unit, a bias line, and N electronic circuits, where N>1. Both the switching unit and the bias line are connected to the control electronics. The N circuits comprise N respective, non-volatilely tunable resistors and N respective frequency-tunable, solid-state qubits, which are connected in series with a respective one of the tunable resistors. That is, each of the N electronic circuits comprises one non-volatile, tunable resistor, connected in series with one qubit, while the N electronic circuits are connected in parallel. The tunable resistors are individually connected to the switching unit. The control electronics are configured to individually tune the resistors via the switching unit, in a configuration mode of the apparatus. The control electronics are further configured to apply a voltage bias to the electronic circuits via the bias line, in an operation mode of the apparatus. Moreover, the electronic circuits are configured to passively apply respective bias signals to the qubits, in response to the voltage bias applied via the bias line (from the control electronics). Such bias signals are, by design, impacted by the tunable resistors (as individually configured in the configuration mode). This, in operation, makes it possible to operate the qubits at respective frequencies determined according to the bias signals applied by the electronic circuits.

The non-volatilely tunable resistors may for example be configured, each, as a gated memristive element and be implemented as non-volatile transistors in their respective circuits. They may notably comprise electrochemical, random access memory devices.

According to another aspect, the invention is embodied as a method of operating a quantum processing apparatus. The method first comprises providing a quantum processing apparatus with a switching unit, a bias line, and N electronic circuits as described above. The method revolves around individually tuning the resistors via the switching unit, in a configuration mode of the apparatus, and then applying a voltage bias to the electronic circuits via the bias line, in an operation mode of the apparatus. This causes the electronic circuits to passively apply respective bias signals to the qubits, wherein such bias signals are impacted by the tunable resistors as individually configured in the configuration mode, so as to operate the qubits at respective frequencies determined according to the bias signals applied by the electronic circuits.

The qubits may possibly be tuned, in frequency, by passively applying voltage biases or current signals to the qubits.

Apparatuses and methods embodying the present invention will now be described, by way of non-limiting examples, and in reference to the accompanying drawings.

BRIEF DESCRIPTION OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which.

Figure 2A:
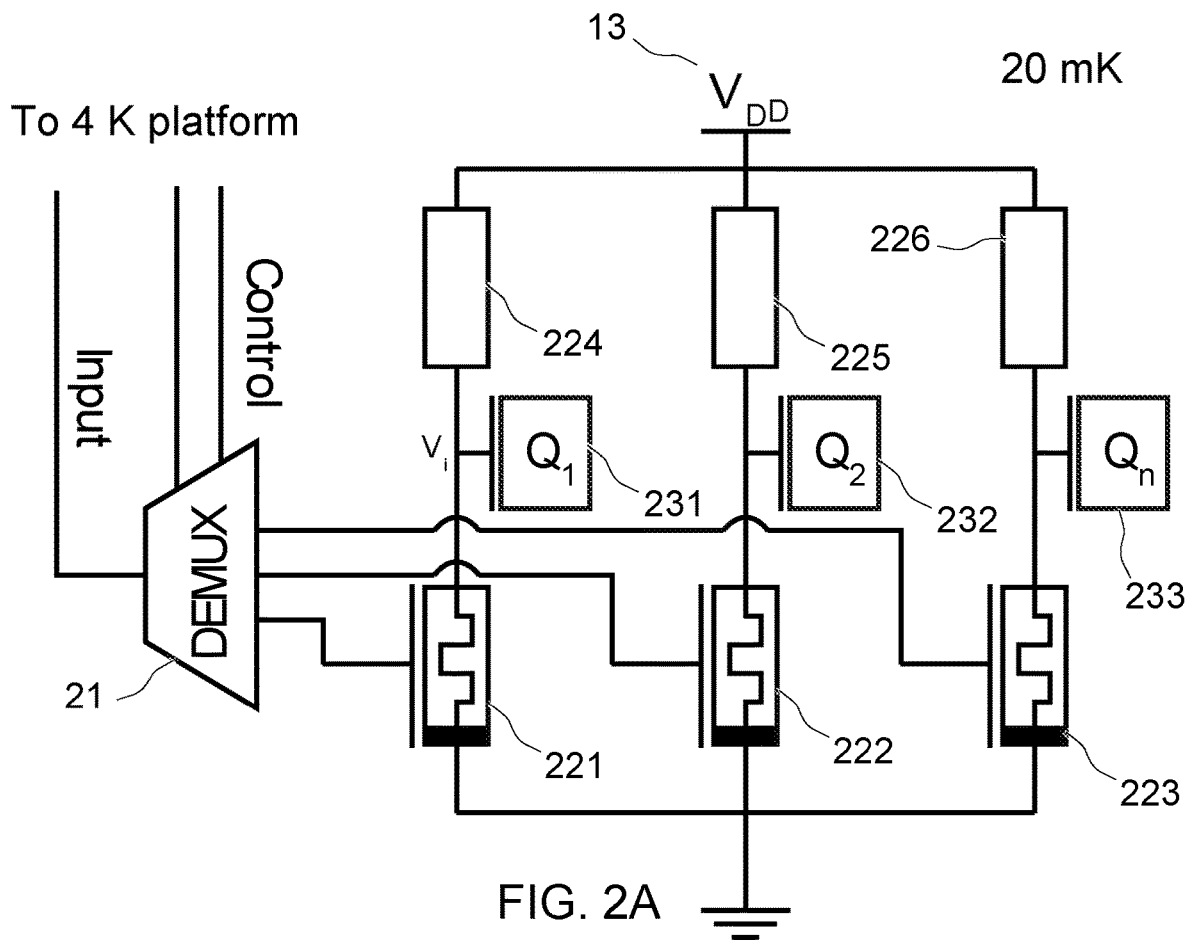
FIG. 2A is a circuit diagram of selected components of an apparatus such as shown in FIG. 1, wherein parallel circuits are configured to passively apply voltage biases to spin qubits, as in embodiments.
Figure 2B:
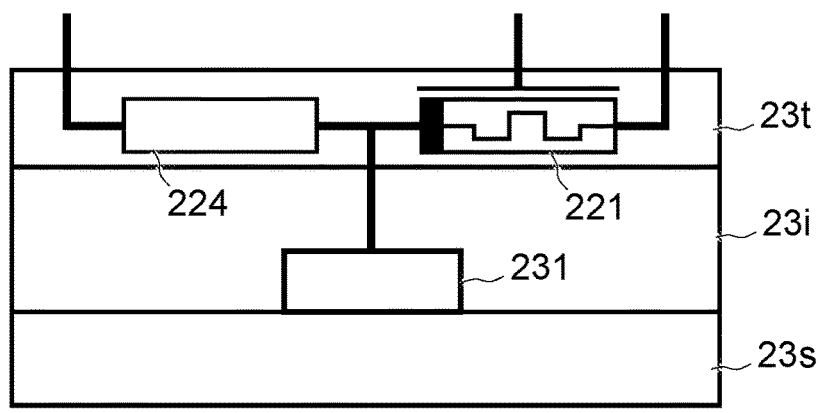
FIG. 2B schematically depicts a 2D cross-sectional view of selected components (at the lowest cryostat stage) of the apparatus shown in FIG. 2A, according to embodiments.

The accompanying drawings show simplified representations of apparatuses or parts thereof, as involved in embodiments. Technical features depicted in FIG. 2B are not necessarily to scale. Similar or functionally similar elements in the figures have been allocated the same numeral references, unless otherwise indicated.

DETAILED DESCRIPTION

As noted in the background section, a brute force approach that is routinely adopted to bias superconducting qubits is to use one bias cable for each qubit (down to the lowest cryostat stage). As it may be realized, such a biasing scheme is not tenable where a large number of qubits is involved, due to size constraints in the cryostat, power dissipation, system costs, and inputs/outputs (I/O) limit of the qubit chip. Therefore, there is a need for a more practical qubit biasing scheme, which nevertheless meets the strict qubit connectivity requirements.

Having realized this issue, the present inventors devised solutions using parallel, non-volatilely tunable resistors, which are tuned prior to operating qubits of the quantum processing apparatus. Such solutions, which reduce both the number of cables and delays occurring on the qubit level, and thus improve the scalability of the quantum processing apparatus, can in fact be applied to several types of solid-state qubits, beyond superconducting qubits, as described in detail in the following description.

Figure 1:
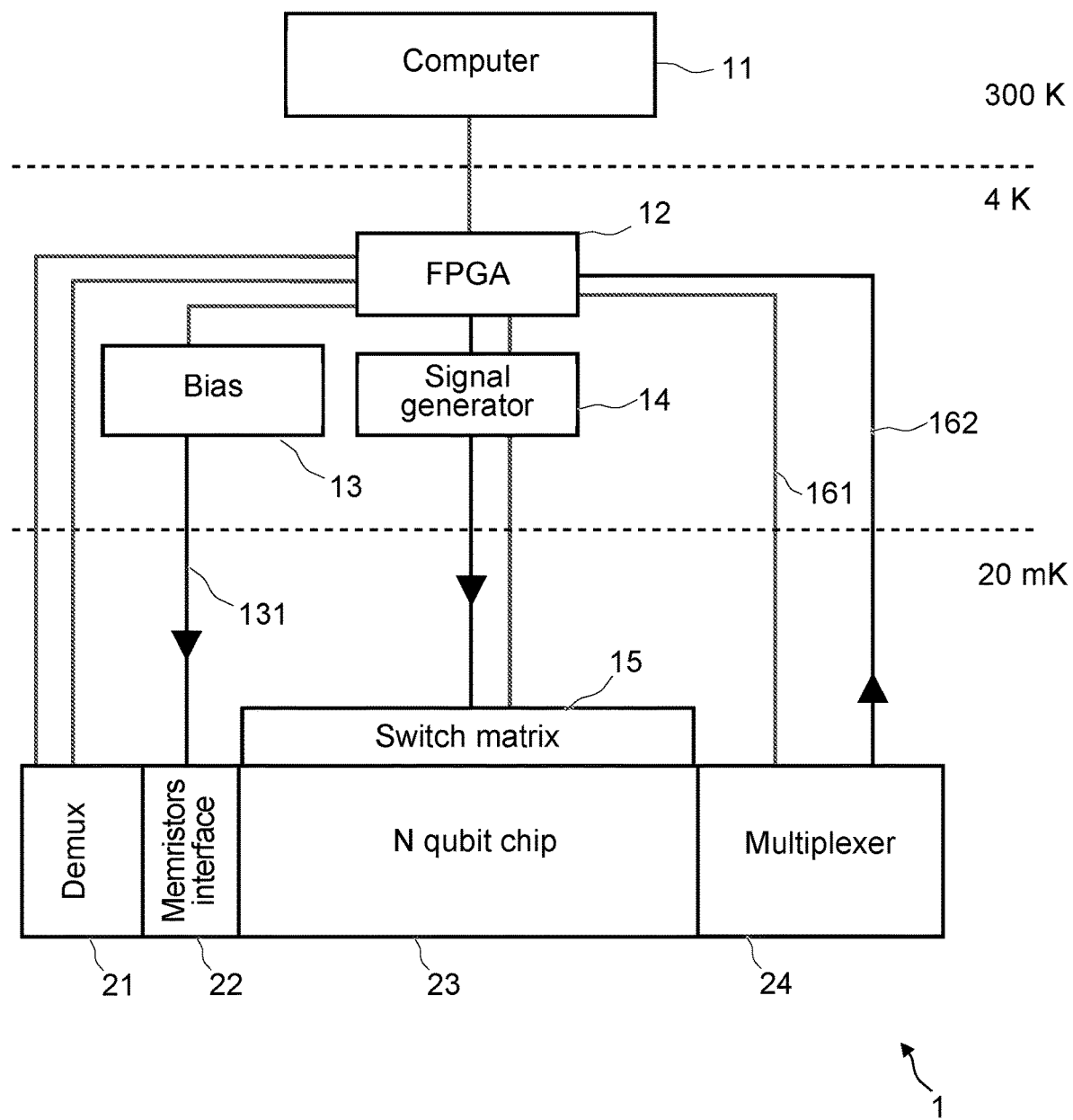
FIG. 1 is a block diagram schematically illustrating selected components of a quantum processing apparatus according to embodiments.
Figure 3:
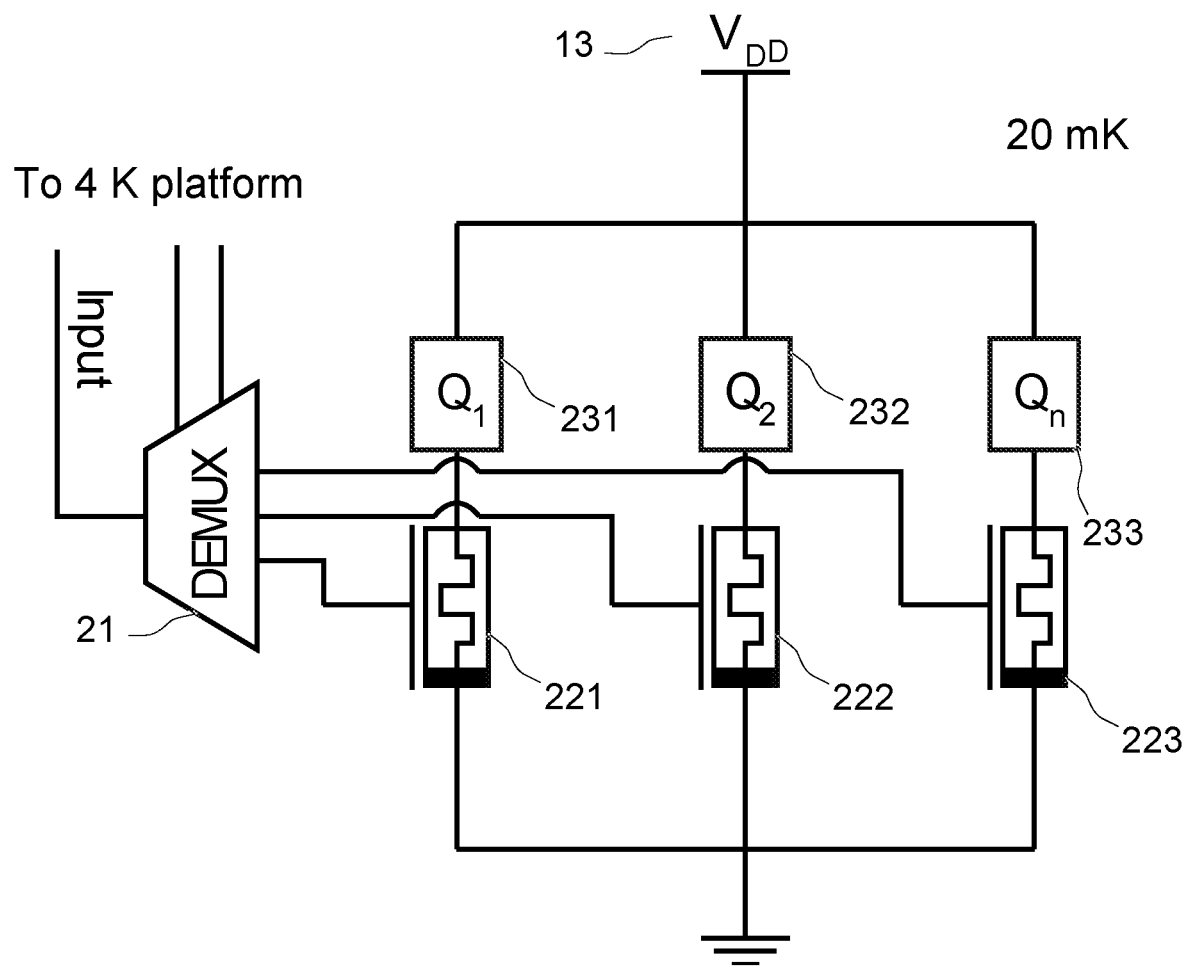
FIG. 3 shows another circuit diagram of selected components of an apparatus such as shown in FIG. 1, wherein the parallel circuits are now designed to passively apply current biases to transmon-type qubits, as in other embodiments.

In reference to FIGS. 1-3, an aspect of the invention is first described, which concerns a quantum processing apparatus 1, i.e., an apparatus for processing information using quantum circuits.

The apparatus 1 notably comprises control electronics 12, a switching unit 21, and a bias line 131. The switching unit 21 is connected to the control electronics 12. So is the bias line 131, although the bias line is connected to control electronics 12 independently from the switching unit 21, as for example seen in FIG. 1.

The apparatus 1 further comprises N electronic circuits 221-233. The circuits connect to the bias line 131 and are arranged in parallel, see FIGS. 2A and 3. Each circuit corresponds to a vertical branch in FIG. 2A or 3. The number N of such circuits corresponds to the number of qubits involved and is strictly larger than one. The accompanying drawings assume only three qubits $Q_1$, $Q_2$, $Q_3$, also denoted by numeral references 231, 232, 233, and thus three electronic circuits 221-233 only, for the sake of depiction. However, it is to be understood that the present solutions preferably involve a fairly large number of qubits, e.g., larger than 50, 100, or even 200, as such solutions become all the more advantageous where a large number of qubits is involved.

In detail, each of the N circuits comprises a respective, non-volatilely tunable resistor 221-223, as well as a respective frequency-tunable, solid-state qubit 231-233, e.g., a superconducting qubit. Such qubits are normally configured as computational qubits in the apparatus. In each circuit, a tunable resistor 221-223 is connected in series with a qubit 231-233 (or a gate thereof). More in detail, in FIG. 2A, each tunable resistor is connected in series with the gate of a respective spin qubit, whereas, in FIG. 3, each tunable resistor is connected with a flux bias line that generates the (transmon) frequency controlling magnetic field. In each case, there are N circuits, which, as a whole, comprise N qubits and N tunable resistors. The resistors 221-223 are individually connected to the switching unit 21, via their respective circuits. The circuits are otherwise connected in parallel. The set of circuits is, as a whole, connected to the control electronics 12 via the bias line 131, see FIGS. 2A and 3. A single bias line 131 is preferably used to connect the control electronics 12 to the circuits, as only one bias line is necessary, see FIG. 1.

The qubits 231-233 may otherwise be connected to a signal generator 14 (e.g., via a switch matrix 15) and to a readout circuit 161, 162 (e.g., via a multiplexer 24), as usual. The signal generator 14 and the readout circuit are typically connected to the control electronics 12, as assumed in FIG. 1.

The apparatus 1 has two modes: a configuration mode for configuring and thereby tuning the tunable resistors; and an operation mode, during which the qubits are operated to perform quantum computations. The control electronics 12 are involved in each of these modes.

In the configuration mode of the apparatus 1, the control electronics 12 are used to individually tune the resistors 221-223 via the switching unit 21, it being reminded that the resistors 221-223 are individually connected to the switching unit (e.g., a demultiplexer). That is, during the configuration, electrical signals are sent by the control electronics 12 to the switching unit 21, which dispatches such signals to a resistor of interest, in order to set the latter to a desired resistive state.

In the operation mode of the apparatus 1, the switching unit 21 is now inactive and the control electronics 12 can be used to apply a voltage bias to the set of electronic circuits 221-233 via the bias line 131. In turn, the electronic circuits 221-233 are configured to passively apply respective bias signals to the qubits 231-233, in response to the voltage bias applied via the bias line 131. Note, the bias signals applied by the electronic circuits 221-233 are, by design of the electronic circuits, impacted by the resistors 221-223 and their respective resistive states, as previously configured, individually, in the configuration mode of the apparatus 1. This, eventually, makes it possible to operate the qubits 231-233 at respective frequencies, wherein such frequencies are determined according to the respective bias signals applied.

The bias voltage applied via the bias line 131 is constant and continuous in the operation mode of the apparatus 1. So are the bias signals applied by the circuits.

The proposed solution makes it possible to reduce wiring in the apparatus 1. This apparatus is typically meant to be operated at very low temperature, hence the benefit of reducing the wiring from the room-temperature platform to the coldest cryogenic platform that comprises the qubits. This solution involves a switching unit 21 (e.g., comprising a demultiplexer), which is used to individually set the tunable resistors (e.g., nonvolatile memristive elements), which can then passively be used to bias the qubits. The number of required biasing wires to the qubit is reduced from $\propto N$ to $\propto \log_2 N$, where N corresponds to the number of qubits. The number $\log_2 N$ stems from the number of logical inputs required to select one out of N output lines. As a result, the proposed approach is all the more advantageous where the quantum processing apparatus comprises a large number of qubits. In addition, as less wiring is needed to bias the qubits, the proposed solution reduces power dissipation at the level of the qubit platform.

By contrast, in the prior art approaches, the scaling of a large number of qubits on a chip has severe issues, in particular with respect to the wiring to the ambient temperature platform, also in terms of power dissipation.

In addition, the proposed scheme makes it possible to keep constant biases during the entire time span at which the qubit is operated. The electronic circuit may for instance be configured as a nonvolatile transistor, e.g., based on a gated memristive element. This makes it possible to suppress any detrimental resistance drift for durations as long as 10 s to 100 s, as the present Inventors have concluded from various experiments and theoretical investigations. Such durations are sufficient to safely operate the qubits.

All this is now described in detail, in reference to particular embodiments of the invention, which assume solid-state qubits operated at very low temperatures. To start with, and as noted above, each of the non-volatilely tunable resistors 221-223 preferably comprises a gated memristive element. The gated memristive elements are connected to the switching unit 21 via respective gates, as depicted in FIGS. 2A and 3. In variants, the non-volatile, tunable resistors may possibly be implemented, each, as a circuit. However, a more efficient solution is to use, e.g., a three terminal memristor. That is, the electronic circuits 221-233 preferably comprise non-volatile transistors, where each transistor includes a respective one of the tunable resistors 221-223. In other words, each tunable resistor 221-223 may be configured as a three-terminal device, respectively connected to the switching unit 21, a respective qubit 231-233, and the ground, as depicted in FIGS. 2A and 3.

In embodiments, the tunable resistors 221-223 comprise, each, a solid-state, electrochemical random access memory (ECRAM). In particular, one may use a three-terminal memristor, implemented as an ECRAM. Solid-state electrochemical capacitors are known per se, see, e.g., J. Tang. et al., "ECRAM as Scalable Synaptic Cell for High-Speed, Low-Power Neuromorphic Computing", IEDM, p.13.1.1, 2018. Briefly, an ECRAM includes a cell operated according to a redox process, which is an electrochemical process (e.g., carried out by applying a negative/positive bias voltage). This causes to exchange chemical elements between the cathode and the anode of the ECRAM, in operation. In turn, this exchange causes to change the electrical conductance of each of the cathode and the anode of the ECRAM. Such devices generally have low power budget and the use of solid components makes them well amenable to integration in hardware, as contemplated herein.

In preferred embodiments, the qubits 231-233 are superconducting quantum circuits, more preferably of the transmon type, as in FIG. 3. Such qubits are controlled by radio frequency (RF) technology and need be operated at temperatures of a few mK only. The RF signals are typically fed into the cryostat with coax cables. In the present case, two channels suffice to control the qubits, see FIG. 1. Attenuators are typically placed on intermediate temperature platforms to thermalize the signals on each of the upward and downward path. In variants, the qubits are configured as spin-based quantum circuits, or spin qubits for short, as assumed in FIGS. 2A and 2B. In other variants, the qubits are topological qubits.

Interestingly, the present approach is compatible with both a voltage or a current biasing. For instance, in embodiments such as depicted in FIGS. 2A and 2B (which assume spin qubits), each of the electronic circuits 221-233 further comprises a non-tunable resistor 224-226. Such resistors 224-226 are connected, each, in series with a gate point of a respective qubits 231-233 and with a respective tunable resistors 221-223, in each electronic circuit. This way, the electronic circuits 221-233 can passively apply respective voltage biases $V_i$ to the qubits 231-233, in response to the voltage bias $V_{DD}$ applied from the bias unit 13 to the set of electronic circuits, via the bias line 131 (see also FIG. 1). That is, the bias signals applied to the qubits are voltage biases in that case. Such voltage biases are, by design, impacted both by the tunable resistors 221-223 and the non-tunable resistors 224-226. In fact, each voltage bias is determined by the bias point between the non-volatile transistors 221-223 and the non-tunable resistors 224-226 In other words, there is a voltage $V_i$ between the input node 13 and a qubit $Q_i$, which is determined by the non-tunable resistor and the current resistive state of the tunable resistor of the corresponding circuit. Note, a mere gate bias would be used in a spin qubit architecture.

The static power dissipation $P_{dc}$ can be estimated to be equal to $P_{dc}=V_{DD}^2/R$ for each qubit cell. Since $V_{DD}$ is typically equal to $\pm 1$ V, very small values can normally be obtained for $P_{dc}$ (typically much smaller than 1 nW) in practice, assuming typical transistor characteristics. This approach is incidentally believed to be more suitable than an approach based on a buck converter scheme, due to the risk of magnetic field pollution from inductors of buck converters, even if the latter provide a more power efficient voltage division, in principle.

The N electronic circuits 221-233 can advantageously be monolithically integrated with the switching unit 21, as assumed in FIG. 2B. Note, the non-volatile transistors 221-223 may possibly be placed at a higher physical level than the qubits in order to further reduce the effect of the dissipated power, as further assumed in FIG. 2B. That is, FIG. 2B shows a substrate 23s, on which are arranged the qubits (only one qubit 231 is seen in FIG. 2B). The respective resistors 221, 224 are arranged in a top layer 23t and separated from the qubit 231 by a thermally insulating spacer 23i.

In variants to voltage biasing schemes, a current biasing scheme can be adopted, as illustrated in FIG. 3. A qubit current sourcing is notably applicable to transmon-type qubits. As seen in FIG. 3, each electronic circuit 221-233 now comprises a qubit 231-233 connected in series with a non-volatile transistor 221-223 (no additional, non-tunable resistor is needed in that case). This makes it possible to passively apply respective current signals to the qubits 231-233, in response to the voltage bias applied via the bias line 131. That is, the bias signals applied are now current signals, to perform current sourcing, i.e., whereby the qubit frequency is tuned by applying a local magnetic field. By design, the current signals applied are impacted by the tunable resistors 221-223.

Referring back to FIG. 1, the quantum information processing apparatus 1 may, as usual, involve a series of successive cooling stages, forming a cryostat in which each stage is adapted to be cooled down at a lower temperature than any previous stage in the series. The apparatus 1 may notably comprise a stage comprising the control electronics 12, and a colder stage including the qubit structure (e.g., a chip). One or more additional stages may possibly be involved, thereby forming a series of successive cooler stages, in operation.

FIG. 1 notably shows a lowest platform adapted to be cooled down at a first temperature (e.g., close to or lower than 20 mK) and an intermediate platform meant to be cooled down at a higher temperature (say 4 K). The qubits 231-233 are arranged on the first platform, while the control electronics 12 are arranged in the intermediate platform. Additional electronics (e.g., I/O devices and/or computers) are typically arranged in an upper platform, meant to be be operated at room temperature. One or more additional platforms may possibly be involved between the upper platform at room temperature and the intermediate platform (4 K). The upper platform may for example comprise a computer 11 connected to the control electronics 12. In variants, or in addition, other I/O devices may be provided, e.g., allowing the apparatus to be operated via such I/O devices, in particular from a cloud.

For completeness, the quantum processing apparatus 1 shown in FIG. 1 further comprises a signal generator unit 14 and a switch matrix 15. The switch matrix is connected to the signal generator unit 14, which is itself connected to the control electronics 12. The qubits 231-233 are, each, connected to a readout circuit 161, 162, which is itself connected to the control electronics 12. The qubits 231-233 are preferably connected via a multiplexer unit 24, as shown in FIG. 1, again to save wirings. Additional elements (not shown) may further be involved, such as pre-amplifiers, low noise amplifiers (LNAs), isolators, DC blocks, filters, multi-channel analog-to-digital converters, etc., as usual in this field.

The switching unit 21 shown FIGS. 1-3 may notably be a demultiplexer. In variants, use is made of a crossbar array, for example. As further shown in FIG. 1, the control electronics 12 may notably comprise a field-programmable gate array (FPGA), or any other logic suitably programmed or otherwise configured to interface with other units 13, 14, as necessary to set the tunable resistors 221-223, bias the qubits 231-233, drive the latter (via a signal generator 14 and a switch matrix 15), and perform read-out operations.

Note, FIGS. 1-3 are schematic drawings, where several electronic components were omitted for clarity. For example, the lines (channels) used to convey RF signals to the qubits and from the qubits (for readout purposes) are not shown in FIGS. 2A and 3. It will nevertheless be apparent to the one skilled in the art that the apparatus 1 will likely comprise other components, such as attenuators, circulators, isolators, amplifiers, including Josephson parametric amplifiers, etc., as known per se.

Figure 4:
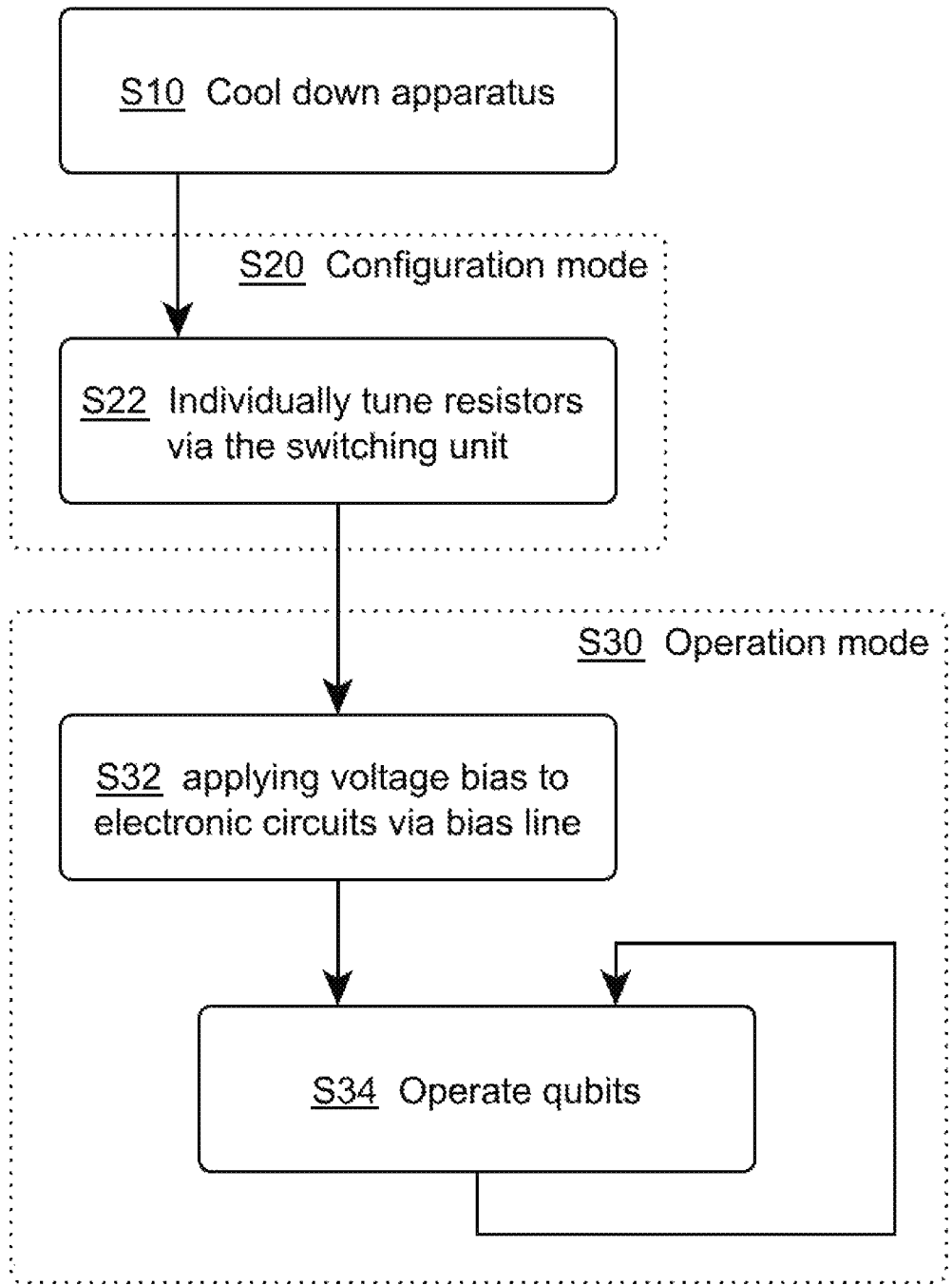
FIG. 4 is a flowchart illustrating high-level steps of a method of operating a quantum processing apparatus, according to embodiments.

Referring primarily to FIG. 4, another aspect of the invention is now described, which concerns a method of operating a quantum processing apparatus 1. Essential aspects of this method have already been described in reference to the present apparatuses. This method is thus only briefly described in the following.

Essentially, the method relies on a quantum processing apparatus 1 as described earlier, i.e., including a switching unit 21, a bias line 131, and N electronic circuits 221-233 (N>1), wherein the N circuits comprise N respective, non-volatilely tunable resistors 221-223 and N respective frequency-tunable, solid-state (e.g., superconducting) qubits 231-233. The tunable resistors 221-223 are individually connected to the switching unit 21. The circuits are connected in parallel, via the bias line 131, to a bias unit 13. Each of the N tunable resistors 221-223 is connected in series with a respective one of the N qubits 231-233 (or a gate thereof), in each electronic circuit.

The method first requires to individually tune S22 the tunable resistors 221-223 via the switching unit 21. This step is performed in a configuration mode S20 of the apparatus 1. Next, the method comprises applying S32 a voltage bias to the electronic circuits 221-233 via the bias line 131, in an operation mode S30 of the apparatus 1. This, as explained earlier, causes the electronic circuits 221-233 to passively apply respective bias signals to the qubits 231-233. Such bias signals are, by design of the electronic circuits, impacted by the resistors 221-223 as individually configured in the configuration mode. Eventually, this makes it possible to operate S34 the qubits 231-233 at respective frequencies, which are determined according to the respective bias signals as passively applied by the electronic circuits.

Such steps are normally performed after having cooled down S10 the apparatus 1 and thermally stabilized the latter, so as for the qubits to be operated at a very low temperature.

As explained earlier in reference to FIG. 2A, each electronic circuit 221-233 may further comprise a non-tunable resistor connected in series with a gate point of a respective qubit 231-233 and with a respective tunable resistor 221-223, to enable voltage sourcing. I.e., this makes it possible to apply voltage biases to the qubits. That is, applying a voltage bias to the electronic circuits 221-233 via the bias line 131 causes the electronic circuits 221-233 to passively apply respective voltage biases to the qubits 231-233, wherein such voltage bias signals are impacted by both the tunable resistors 221-223 and the non-tunable resistors 224-226.

In variants, current sourcing is relied on, see FIG. 3. Here, the qubits 231-233 are, each, connected in series with a respective one of the tunable resistors 221-223; no non-tunable resistor is needed. Applying a voltage bias to the electronic circuits 221-233 via the bias line 131 now causes the electronic circuits 221-233 to passively apply respective current signals to the qubits 231-233. Again, the current signals are impacted by the tunable resistors 221-223.

While the present invention has been described with reference to a limited number of embodiments, variants and the accompanying drawings, it will be understood by those skilled in the art that various changes may be made, and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A quantum processing apparatus, wherein the apparatus comprises:
   control electronics;
   a switching unit, connected to the control electronics;
   a bias line, connected to the control electronics;
   N electronic circuits, N>1, wherein the N circuits are connected, in parallel, to the control electronics via the bias line, and comprise:
   N respective, non-volatilely tunable resistors that are individually connected to the switching unit; and
   N respective frequency-tunable, solid-state qubits, each connected in series with a respective one of the N tunable resistors,
   wherein
   the control electronics are configured to:
   individually tune the resistors via the switching unit, in a configuration mode of the apparatus; and
   apply a voltage bias to the electronic circuits via the bias line, in an operation mode of the apparatus, and
   the electronic circuits are configured to passively apply respective bias signals to the qubits, in response to the voltage bias applied via the bias line, wherein such bias signals are impacted by the resistors as individually configured in the configuration mode, so as to operate the qubits at respective frequencies determined according to the respective bias signals.

2. The quantum processing apparatus according to claim 1, wherein each of the non-volatilely tunable resistors comprises a gated memristive element that is connected to the switching unit via a gate.

3. The quantum processing apparatus according to claim 1, wherein the electronic circuits comprise respective non-volatile transistors, the non-volatile transistors each comprising a respective one of the tunable resistors, wherein each of the non-volatile transistors has three terminals, which are connected to the switching unit, one of the qubits, and a ground, respectively.

4. The quantum processing apparatus according to claim 1, wherein the tunable resistors comprise, each, an electrochemical, random access memory.

5. The quantum processing apparatus according to claim 1, wherein the switching unit is a demultiplexer.

6. The quantum processing apparatus according to claim 1, wherein the solid-state qubits are superconducting qubits configured as transmon-type qubits.

7. The quantum processing apparatus according to claim 1, wherein
each of the electronic circuits further comprises a non-tunable resistor, which is connected in series with a gate point of a respective one of the qubits and with a respective one of the tunable resistors, and
the electronic circuits are configured to passively apply respective voltage biases to the qubits via the tunable resistors, in response to the voltage bias applied via the bias line, whereby each of the respective voltage biases applied is impacted by both the tunable resistor and the non-tunable resistor of each of the electronic circuits.

8. The quantum processing apparatus according to claim 1, wherein
in each of the electronic circuits, a respective one of the qubits is connected in series with a respective one of the tunable resistors, and
the electronic circuits are configured to passively apply respective current signals to the qubits, in response to the voltage bias applied via the bias line, whereby each of the current signals applied is impacted by the tunable resistors of each of the electronic circuits.

9. The quantum processing apparatus according to claim 1, wherein
the apparatus comprises at least two platforms, the two platforms comprising a first platform adapted to be cooled down at a first temperature and a second platform adapted to be cooled down at a second temperature that is larger than the first temperature, and
the qubits are arranged on the first platform, while the control electronics are arranged on the second platform.

10. The quantum processing apparatus according to claim 9, wherein the apparatus comprises a third platform designed to be operated at room temperature, wherein the third platform comprises a computer connected to the control electronics.

11. The quantum processing apparatus according to claim 1, wherein the control electronics comprise a field-programmable gate array.

12. The quantum processing apparatus according to claim 1, wherein the quantum processing apparatus further comprises a signal generator unit and a switch matrix, the switch matrix connected to the signal generator unit, the signal generator unit connected to the control electronics.

13. The quantum processing apparatus according to claim 1, wherein the qubits are each connected to a readout circuit connected to the control electronics.

14. The quantum processing apparatus according to claim 1, wherein the N electronic circuits are monolithically integrated with the switching unit.

15. A method of operating a quantum processing apparatus, the method comprising
providing a quantum processing apparatus with a switching unit, a bias line, and N electronic circuits, N>1, wherein the N circuits are connected, in parallel, to the control electronics via the bias line, and wherein the N circuits comprise:
N respective, non-volatilely tunable resistors that are individually connected to the switching unit; and
N respective frequency-tunable, solid-state qubits, each connected in series with a respective one of the N tunable resistors,
individually tuning the resistors via the switching unit, in a configuration mode of the apparatus, and
applying a voltage bias to the electronic circuits via the bias line, in an operation mode of the apparatus, to cause the electronic circuits to passively apply respective bias signals to the qubits, wherein such bias signals are impacted by the tunable resistors as individually configured in the configuration mode, so as to operate the qubits at respective frequencies determined according to the respective bias signals applied thereto.

16. The method according to claim 15, wherein each of the electronic circuits of the apparatus further comprises a non-tunable resistor connected in series with a gate point of a respective one of the qubits and with a respective one of the tunable resistors, whereby applying the voltage bias to the electronic circuits via the bias line causes the electronic circuits to passively apply respective voltage biases to the qubits, wherein such voltage biases are impacted by the resistors.

17. The method according to claim 15, wherein, in each of the electronic circuits of the apparatus, a respective one of the qubits is connected in series with a respective one of the tunable resistors, whereby applying the voltage bias to the electronic circuits via the bias line causes the electronic circuits to passively apply respective current signals to the qubits, the current signals being impacted by the tunable resistors.

18. The method according to claim 15, wherein the apparatus comprises at least two platforms, the at least two platforms comprising a first platform in which the qubits are arranged and a second platform comprising the control electronics, the method further comprising cooling down the first platform at a first temperature and cooling down the second platform at a second temperature that is larger than the first temperature, in both the configuration mode and the operation mode of the apparatus.

\* \* \* \* \*